(12) United States Patent
Nagata et al.

(10) Patent No.: US 8,980,448 B2
(45) Date of Patent: Mar. 17, 2015

(54) MAGNETIC RECORDING MEDIUM INCLUDING AN AMORPHOUS CARBON PROTECTIVE FILM

(75) Inventors: Naruhisa Nagata, Kedah Darul Aman (MY); Ryoji Kobayashi, Matsumoto (JP); Yoshihisa Suzuki, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 66 days.

(21) Appl. No.: 13/816,257

(22) PCT Filed: Feb. 23, 2011

(86) PCT No.: PCT/JP2011/001045
§ 371 (c)(1),
(2), (4) Date: Apr. 8, 2013

(87) PCT Pub. No.: WO2012/060023
PCT Pub. Date: May 10, 2012

(65) Prior Publication Data
US 2013/0196177 A1    Aug. 1, 2013

(30) Foreign Application Priority Data
Nov. 2, 2010    (JP) .................................. 2010-246358

(51) Int. Cl.
G11B 5/66    (2006.01)
G11B 5/72    (2006.01)
G11B 5/725    (2006.01)
C23C 16/26    (2006.01)

(52) U.S. Cl.
CPC ...... *G11B 5/72* (2013.01); *G11B 5/725* (2013.01); *C23C 16/26* (2013.01)

USPC ........................................................ 428/835.4

(58) Field of Classification Search
None
See application file for complete search history.

(56) References Cited

U.S. PATENT DOCUMENTS

| 5,773,124 A | 6/1998 | Ishikawa |
| 6,764,757 B1 * | 7/2004 | Wu et al. .................... 428/835.4 |
| 2007/0127158 A1 * | 6/2007 | Tran ............................... 360/134 |
| 2010/0086808 A1 | 4/2010 | Nagata |
| 2010/0232065 A1 | 9/2010 | Suzuki et al. |

FOREIGN PATENT DOCUMENTS

| JP | 63-078328 A | 4/1988 |
| JP | 06-301969 A | 10/1994 |
| JP | 08-129747 A | 5/1996 |

(Continued)

OTHER PUBLICATIONS

Chinese Office Action dated Dec. 1, 2014 with partial English translation.

*Primary Examiner* — Holly Rickman
(74) *Attorney, Agent, or Firm* — Rabin & Berdo, P.C.

(57) ABSTRACT

A magnetic recording medium includes a substrate; a metal film layer disposed on the substrate; a protective film disposed on the metal film layer; and a lubricant film disposed on a surface of the protective film. The protective film is composed of amorphous carbon containing fluorine and nitrogen in a surface region, and a region deeper than 0.5 nm deep from the surface of the protective film is substantially free from the fluorine and nitrogen. The fluorine and nitrogen may be each added in an amount of 5 to 20 at. %. The present invention simultaneously accomplishes a reduction in film thickness, an improvement in durability and corrosion resistance, and an improvement of the bonding strength of the surface of the protective film to the lubricating film.

7 Claims, 2 Drawing Sheets

(56) References Cited

FOREIGN PATENT DOCUMENTS

| JP | 09-044844 A | 2/1997 |
| JP | 10-198953 A | 7/1998 |
| JP | 2001-195723 A | 7/2001 |
| JP | 2007-265586 A | 10/2007 |
| JP | 2009-211765 A | 9/2009 |
| JP | 2010-020832 A | 1/2010 |
| JP | 2010-055680 A | 3/2010 |

* cited by examiner

MAGNETIC RECORDING MEDIUM INCLUDING AN AMORPHOUS CARBON PROTECTIVE FILM

BACKGROUND OF THE ART

1. Field of the Invention

The present invention relates to a protective film and a magnetic recording medium having the protective film.

2. Background of the Related Art

A hard coating made of various materials is used as a coating on a sliding resistance member or an antifriction member. A diamond-like carbon (DLC) film made from carbon has been known as such a hard coating. The DLC film is suitable as a surface coating due to its excellent surface smoothness and high hardness. Conventionally, DLC films are formed by a sputtering method, plasma CVD method, and the like.

A magnetic recording medium generally includes a protective film composed of a DLC film on a magnetic recording layer, the DLC film being formed by a plasma CVD method. The protective film is formed for the purpose of protecting the magnetic recording layer from corrosion and being damaged by a magnetic head that comes into contact with or slides on the magnetic recording layer. The magnetic recording medium is, therefore, provided with durable and corrosion-resistant functions.

In recent years, the recording method for a magnetic recording medium has been changing from the longitudinal recording method to the perpendicular recording method capable of increasing the recording density. As with the longitudinal recording method, the perpendicular recording method needs to maintain good electromagnetic conversion characteristics to further increase the recording density by making the protective film of a magnetic recording medium as thin as possible.

Japanese Patent Application Publication No. 2010-55680 (Patent Document 1) proposes a method for processing a protective film, which is formed by a plasma CVD method using hydrocarbon gas, with argon plasma and nitrogen plasma in order to make the protective film thin.

Japanese Patent Application Publication No. H8-129747 (Patent Document 2) proposes the use of a laminated constitution of a DLC film/fluorine-containing DLC film as a protective film of a magnetic recording medium.

Moreover, Japanese Patent Application Publication No. H6-301969 (Patent Document 3) proposes a step of plasma post-processing a protective film made from a carbon-based material, by using inactive gas such as $N_2$ or fluorinated carbon based gas such as $CF_4$. This processing changes the density or resistance of the protective film in a film thickness direction and increases the resistance and density of a surface layer, to reduce the film thickness of the protective film.

Unfortunately, it is difficult for these conventional technologies to simultaneously accomplish reduction in the film thickness of a protective film, improvement of the durability and corrosion resistance of the protective film, and improvement of the bonding strength of the surface of the protective film to a lubricating film.

An object of the present invention is to provide a protective film that is reduced in film thickness and provided with improved durability and corrosion resistance and improved bonding strength of the surface of the protective film to a lubricating film, and a magnetic recording medium having such a protective film. Another object of the present invention is to provide a magnetic recording medium that has the protective film and excellent electro-magnetic conversion characteristics.

SUMMARY OF THE INVENTION

A protective film for a magnetic recording medium according to a first aspect of the present invention contains fluorine and nitrogen. It is preferred that the fluorine be present in a region 0.5 nm deep from a surface of the protective film. It is also preferred that the nitrogen be present in a region 0.5 nm deep from the surface of the protective film. Preferably, the film thickness of the protective film is equal to or greater than 1.7 nm but equal to or less than 2.3 nm. The protective film is preferably made from amorphous carbon. It is preferred that the fluorine be added in an amount of 5 to 20 at. % (atomic percent) and the nitrogen in an amount of 5 to 20 at. %.

A magnetic recording medium according to a second aspect of the present invention has a substrate, a metal film layer placed on the substrate, and a protective film placed on the metal film layer, wherein the protective film is the protective film described in the first aspect. A lubricating film may be placed on the protective film. It is preferred that the film thickness of the lubricating film be equal to or greater than 0.6 nm but equal to or less than 1.0 nm.

A method for producing a protective film for a magnetic recording medium according to a third aspect of the present invention has a step of forming the protective film on a stacked body containing a substrate and a metal film layer formed on the substrate, and a step of plasma-processing the protective film in a fluorine-containing gas and a nitrogen-containing gas.

The present invention can simultaneously accomplish reduction in film thickness of the protective film, improvement of the durability and corrosion resistance of the protective film, and improvement of the bonding strength of the surface of the protective film to the lubricating film. Furthermore, the magnetic recording medium with the protective film can achieve excellent electromagnetic conversion characteristics.

Better durability and corrosion resistance can be obtained by adding fluorine to a region 0.5 nm deep from the surface of the protective film. When the lubricating film is provided on the surface of the protective film, the lubricating film can be prevented from falling off the surface of the protective film, by adding nitrogen to a region 0.5 nm deep from the surface of the protective film. Setting the film thickness of the protective film at a value equal to or greater than 1.7 nm but equal to or less than 2.3 nm can eliminate the spacing loss with respect to a magnetic head. As a result, excellent electromagnetic conversion characteristics, durability, and corrosion resistance can be realized. Excellent durability and corrosion resistance can be realized by adding the fluorine and nitrogen in an amount of 5 to 20 at. %. Placing the lubricating film on the protective film and setting the film thickness of the lubricating film at a value equal to or greater than 0.6 nm but equal to or less than 1.0 nm can eliminate the spacing loss with respect to the magnetic head and realize excellent electromagnetic conversion characteristics and durability.

According to the present invention, the fluorine improves the durability and corrosion resistance of the surface of the protective film, and the nitrogen improves the bonding strength of the surface of the protective film to the lubricating film. The inventors of the present invention have discovered that the fluorine for improving the durability and corrosion resistance of the surface of the protective film and the nitrogen for improving the bonding strength of the surface of the protective film can simultaneously exert the beneficial effects thereof by existing in the vicinity of the surface of the protective film. The inventors of the present invention have discovered that the durability and corrosion resistance of the protective film and peel-resistant characteristics of the protective film to the lubricating film can be maintained by using both the fluorine-containing gas and the nitrogen-containing gas when performing gas plasma processing on the protective film. The reason why it has conventionally been difficult to use both fluorine-containing gas and nitrogen-containing gas in a gas plasma process of a protective film is because the use of both fluorine-containing gas and nitrogen-containing gas deteriorates either the beneficial effects exhibited by fluorine or the beneficial effects exhibited by nitrogen. Optimization of conditions for the gas plasma process is taken into special consideration when using both fluorine-containing gas and nitrogen-containing gas in the gas plasma process of the protective film.

DETAILED DESCRIPTION OF THE INVENTION

Figure 1:
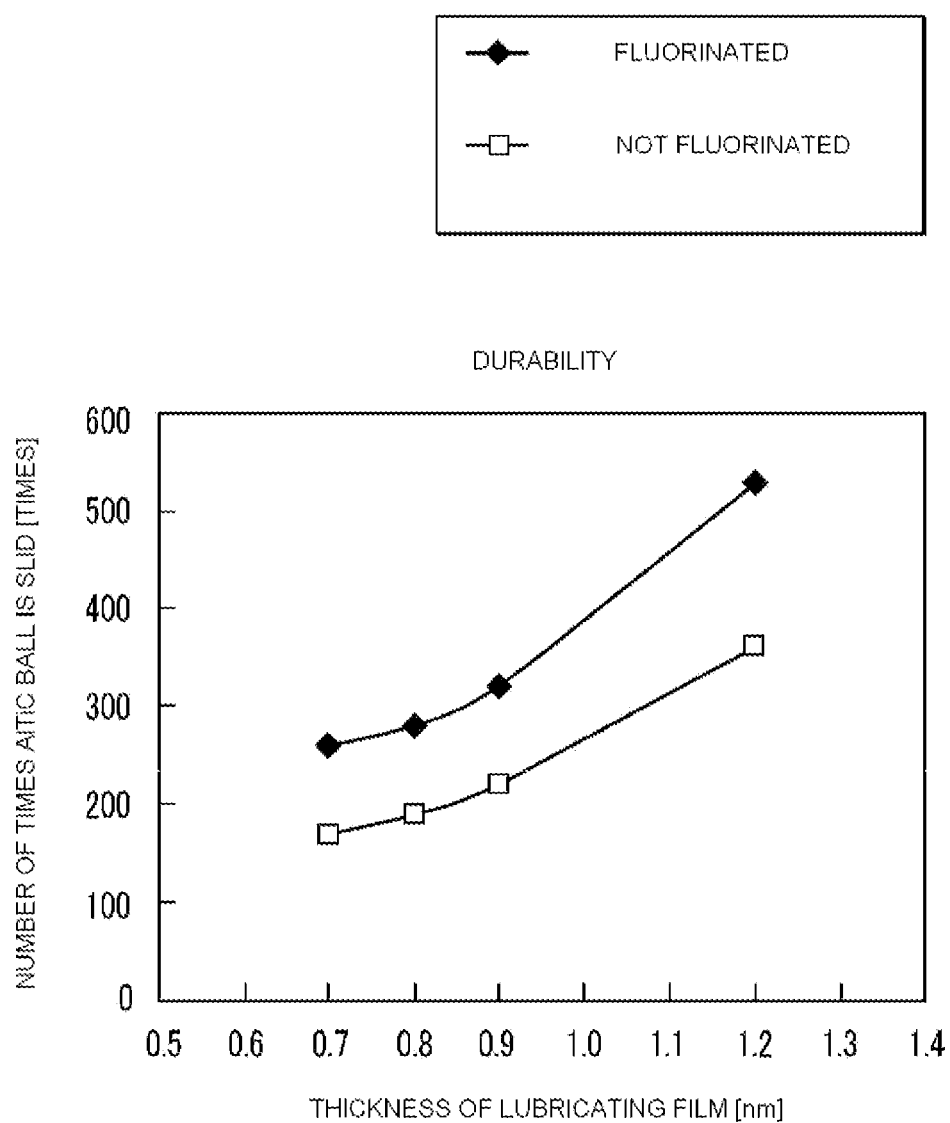
FIG. 1 is a diagram showing how the durability of a protective film depends on the film thickness of a lubricating film.
Figure 2:
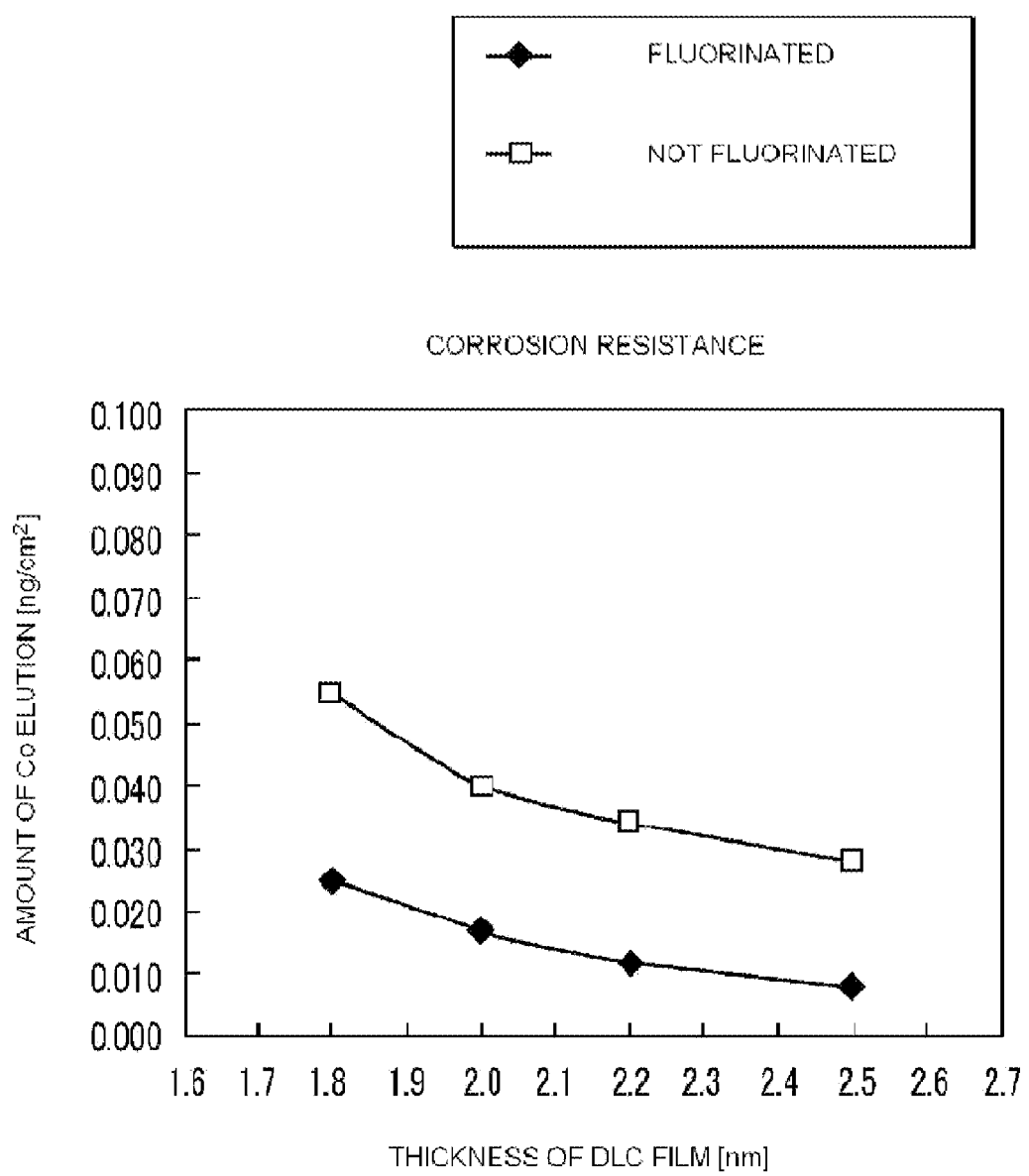
FIG. 2 is a diagram showing how the corrosion resistance of the protective film depends on the film thickness of a DLC film.

In an embodiment for implementing the present invention, preferably an amorphous carbon film is formed as a protective film by using a plasma CVD method using hydrocarbon gas as a source material. It is preferred that the amorphous carbon be DLC. Examples of the hydrocarbon gas that can be used here include ethylene, acethylene, methane, and benzene. The protective film of the present invention includes fluorine and nitrogen in addition to the amorphous carbon contained as a primary component, as a result of a plasma process described hereinafter. In examples that are described hereinafter, a DLC film is formed as the protective film, and a plasma CVD device is used for forming the DLC film.

A film formation substrate on which the protective film is formed is formed by stacking a metal film layer on the substrate. The metal film layer formed on the substrate includes at least a magnetic recording layer. The metal film layer may optionally include a nonmagnetic underlayer, a soft magnetic layer, a seed layer, an intermediate layer, and other layers between the magnetic recording layer and the substrate. The examples that are described hereinafter use a film formation substrate obtained by forming an underlayer, intermediate layer, and magnetic recording layer on an aluminum substrate having a diameter of 95 mm and a thickness of 1.75 mm.

The substrate is preferably nonmagnetic and can be made from any material that has conventionally been used for producing a magnetic recording medium. The substrate can be made from, for example, a Ni—P plated aluminum alloy, glass, ceramic, plastic, or silicon.

The magnetic recording layer can be formed using a ferromagnetic material such as an alloy containing at least Co and Pt. An easy axis of magnetization of the ferromagnetic material needs to be oriented in a direction of performing magnetic recording. For instance, when performing perpendicular magnetic recording, the easy axis of magnetization (a c-axis with a hexagonal closest packing (hcp) structure) of a material of the magnetic recording layer needs to be oriented in a direction perpendicular to a surface of the recording medium (i.e., a principle plane of the substrate).

It is also preferred that a material with a granular structure be used to form a perpendicular magnetic recording layer consisting of a single layer or multiple layers. The granular structure has magnetic crystal grains dispersed in a non-magnetic oxide matrix or a non-magnetic nitride matrix. Examples of the material with a granular structure that is used here include $CoPt—SiO_2$, $CoCrPtO$, $CoCrPt—SiO_2$, $CoCrPt—TiO_2$, $CoCrPt—Al_2O_3$, $CoPt—AlN$, and $CoCrPt—Si_3N_4$, but are not limited thereto. In the present invention, the use of the material having a granular structure can promote magnetic separation between the magnetic crystal grains that are adjacent to each other in the perpendicular magnetic recording layer. As a result, noise can be reduced and the characteristics of the medium such as its SNR and recording resolution can be improved.

The non-magnetic underlayer that may be provided optionally can be formed using Ti or a non-magnetic material including Cr, such as a CrTi alloy.

The soft magnetic layer that may be provided optionally can be formed using a crystalline material such as FeTaC or Sendust (FeSiAl) alloy; a microcrystalline material such as FeTaC, CoFeNi, or CoNiP; or an amorphous material that includes a Co alloy such as CoZrNd, CoZrNb, or CoTaZr. The soft magnetic layer functions to concentrate a perpendicular magnetic field generated by a magnetic head, in a magnetic recording layer of a perpendicular magnetic recording medium.

The optimal value of the film thickness of the soft magnetic layer changes depending on the structure or characteristics of the magnetic head used for recording. Generally, it is preferred that the film thickness of the soft magnetic layer be approximately equal to or greater than 10 nm but equal to or less than 500 nm in terms of the productivity.

The seed layer that may be provided optionally can be formed using a permalloy material such as NiFeAl, NiFeSi, NiFeNb, NiFeB, NiFeNbB, NiFeMo, or NiFeCr; a material obtained by adding Co to a permalloy material, such as CoNiFe, CoNiFeSi, CoNiFeB, or CoNiFeNb; Co; or a Co-based alloy such as CoB, CoSi, CoNi, or CoFe. It is preferred that the seed layer be thick enough to control the crystalline structure of the magnetic recording layer and normally have a film thickness of at least 3 nm but no more than 50 nm.

The intermediate layer that may be provided optionally can be formed using Ru or an alloy that mainly contains Ru. It is preferred that the intermediate layer normally have a film thickness of at least 0.1 nm but no more than 20 nm. The film thickness in this range can provide the magnetic recording layer with the characteristics required to achieve high density recording, without degrading the magnetic characteristics or electromagnetic conversion characteristics of the magnetic recording layer.

The non-magnetic underlayer, the soft magnetic layer, the seed layer, the intermediate layer, and the magnetic recording layer can be formed using any method known in the technology, such as a sputtering method (a DC magnetron sputtering method, RF magnetron sputtering method, etc.) or a vacuum evaporation method.

The protective film can be formed using a plasma CVD method. Power for generating plasma may be supplied using a capacitive coupling system or an inductive coupling system. The power to be supplied can be DC power, HF power (frequency: several tens to several hundreds, kHz), RF power (frequency: 13.56 MHz, 27.12 MHz, 40.68 MHz, etc.), a microwave (frequency: 2.45 GHz), or the like. A parallel plate type apparatus, filament type apparatus, ECR plasma generator, helicon wave plasma generator, or the like can be used as an apparatus for generating plasma. In the present invention a filament type plasma CVD apparatus is preferably used. In the examples described hereinafter, by using the filament type plasma CVD apparatus, a predetermined current is supplied to a cathode filament to discharge thermoelectrons, and at the same time ethylene gas is introduced into the apparatus to generate ethylene plasma.

A bias voltage may be applied to a substrate and a stacked body of metal film layer being used as a film formation substrate to promote deposition of the DLC film. For example, a voltage of −40 to −120 V can be applied to the film formation substrate. In the examples described hereinafter, deposition species are drawn to the film formation substrate by means of a substrate bias, to form the DLC film. In this case, an anode potential is +60 V and a substrate bias potential is −120 V.

It is preferred that the film thickness of the protective film be equal to or greater than 1.7 nm but equal to or less than 2.3 nm. The film thickness of the protective film less than 1.7 nm deteriorates the durability and corrosion resistance of the protective film. The film thickness of the protective film exceeding 2.3 nm increases spacing loss with respect to the magnetic head and deteriorates the electromagnetic conversion characteristics.

Fluorine-based gas such as tetrafluoromethane gas or hexafluoroethane gas can be used as fluorine-containing gas for introducing fluorine to the protective film. The fluorine-containing gas may be pure fluorine-based gas or mixed gas of fluorine-based gas with other gas. In this case, examples of the other gas include helium, neon, argon, and other inactive gas.

Nitrogen-containing gas for introducing nitrogen to the protective film may be pure nitrogen gas or mixed gas of nitrogen gas with other gas. In this case, examples of the other gas include helium, neon, argon, and other inactive gas.

Plasma generating means can be used for introducing fluorine and nitrogen to the protective film. Power supply system and apparatus for generating plasma, as well as power to be supplied, can be the same as those used for forming the protective film. For instance, another plasma CVD apparatus of the same type as the plasma CVD apparatus used for forming the protective film can be used. Alternatively, displacing gas inside the plasma CVD apparatus used for forming the protective film can allow fluorine and nitrogen to be introduced to the protective film by using the plasma CVD apparatus used for forming the protective film.

It is preferred that the fluorine be present in a region 0.5 nm deep from a surface of the protective film. When the fluorine is present in a region that is deeper than the region 0.5 nm deep from the surface of the protective film, the bonding between the surface of the protective film and a lubricating film worsens and not preferred. The depth of the region where the fluorine is present is controlled based on a plasma processing time period taken for a plasma processing step. The plasma processing time period is preferably within a range of 0.5 to 2.0 seconds.

It is preferred that the nitrogen be present in a region 0.5 nm deep from the surface of the protective film. When the nitrogen is present in a region that is deeper than the region 0.5 nm deep from the surface of the protective film, the corrosion resistance of the protective film worsens and not preferred. The depth of the region where the nitrogen is present is controlled based on the plasma processing time period taken for the plasma processing step. The plasma processing time period is preferably within a range of 0.5 to 2.0 seconds.

It is preferred that the nitrogen and the fluorine be each added in an amount of 5 to 20 at. % in reference to a total number of atoms in the protective film. When the amount of nitrogen added is less than 5 at. %, the bonding between the surface of the protective film and the lubricating film worsens and not preferred. When the amount of nitrogen added exceeds 20 at. %, the corrosion resistance of the protective worsens and not preferred. When the amount of fluorine added is less than 5 at. %, the durability and corrosion resistance of the protective film worsen and not preferred. When the amount of fluorine added exceeds 20 at. %, the bonding between the surface of the protective film and the lubricating film worsens and not preferred.

It is preferred that the lubricating film be placed on the protective film and that the film thickness of the lubricating film be equal to or greater than 0.6 nm but equal to or less than 1.0 nm. The film thickness of the lubricating film less than 0.6 nm deteriorates the durability of the protective film. The film thickness of the lubricating film exceeding 1.0 nm increases spacing loss with respect to the magnetic head and deteriorates the electromagnetic conversion characteristics.

When tetrafluoromethane gas is used as the fluorine-containing gas, the flow rate of the tetrafluoromethane gas is preferably 20 sccm to 100 sccm in order to keep stable discharge. When pure nitrogen gas is used as the nitrogen-containing gas, the flow rate of the nitrogen gas is preferably 20 sccm to 100 sccm in order to keep stable discharge.

It is preferred that the protective film be subjected to the plasma processing under the presence of both the fluorine-containing gas and the nitrogen-containing gas. This is because the durability and corrosion resistance of the protective film and the bonding between the surface of the protective film and the lubricating film can be improved by the fluorine and the nitrogen, respectively, within the short plasma processing time period. Furthermore, the plasma processing described above can increase the number of magnetic recording media to be produced per unit time. It is also preferred that the protective film be subjected to the plasma processing in the fluorine-containing gas and that the protective film be subsequently subjected to the plasma processing in the nitrogen-containing gas. This is because the durability and corrosion resistance of the protective film and the bonding between the surface of the protective film and the lubricating film can significantly be improved by the fluorine and the nitrogen, respectively.

The present invention is characterized in that the region 0.5 nm deep from the surface of the protective film (preferably the DLC film) contains fluorine and nitrogen at the same time. The fluorine has the effect of improving the durability and corrosion resistance of the protective film. The nitrogen has the effect of ensuring the bonding between the surface of the protective film and the lubricating film. In the examples described hereinafter, deterioration of the performance of the protective film, which is caused by lacking either the fluorine or the nitrogen, is illustrated by reference to comparative examples.

EXAMPLE

Example 1

First of all, an underlayer, intermediate layer, and magnetic recording layer were sequentially stacked on an aluminum substrate having a diameter of 95 mm and a thickness of 1.75 mm, to form a film formation substrate. The underlayer was made from CoZrNb and had a film thickness of 40 nm. The intermediate layer was made from Ru and had a film thickness of 15 nm. The magnetic recording layer was made from CoCrPt—$SiO_2$ and had a film thickness of 15 nm.

The obtained film formation substrate was installed in a film forming chamber of the filament type plasma CVD apparatus. Ethylene gas was introduced to the film forming chamber at a flow rate of 40 sccm. DC power of 180 V was applied between the cathode filament and an anode. Thermoelectrons were discharged from the cathode filament, to generate ethylene plasma. The pressure inside the film forming chamber was 0.53 Pa. A bias voltage of −120 V (to the ground) was applied to the film formation substrate, to deposit a DLC film thereon. The anode potential was +60 V. Film formation time was adjusted, and a DLC film with a film thickness of 2.2 nm was formed, on condition that the flow rate of the ethylene gas was 40 sccm and an emission current was 0.50 A.

In another plasma CVD apparatus of the same type as the abovementioned plasma CVD apparatus, the surface of the DLC film was nitrided and fluorinated on condition that the flow rate of the nitrogen gas was 50 sccm, the flow rate of the tetrafluoromethane gas 40 sccm, and the processing time period 1.0 s.

The film thickness of the DLC film was measured using an XRF (X-ray Fluorescence). The composition and depth profile of the DLC film were measured using an XPS (X-ray Photoelectron Spectroscopy). The DLC film consisted mainly of carbon and hydrogen, and fluorine and nitrogen were present in regions approximately 0.4 nm deep from the surface of the DLC film. The film thickness of the DLC film was still 2.2 nm. The fluorine was added in an amount of 10 at. %. The nitrogen was added in an amount of 10 at. %.

A liquid lubricant that mainly contains perfluoropolyether was applied to the protective film obtained in the manner described above by using a dip method, to form a lubricating film having a film thickness of 0.9 nm.

An AlTiC ball with a diameter of 2 mm was slid along the sample prepared in the manner described above, with a predetermined load and at a predetermined linear velocity, to measure how many times the AlTiC ball needed to be slid until the protective film would break. With this sample of the present example, it took a large count of 320 times to break the protective film. This result indicates that the sample of the present example has excellent durability.

Nitric acid aqueous solution of a predetermined concentration was dropped on the sample that was prepared in the manner described above and then extracted, to measure the amount of Co elution by means of an ICP-MS (Inductively Coupled Plasma-Mass Spectrometry). The amount of Co elution in the sample of the present example was as low as 0.012 $ng/cm_2$. This result indicates that the sample of the present example has excellent corrosion resistance.

Example 2

In the same manner as Example 1, a protective film with a film thickness of 2.2 nm was formed. The surface of the DLC film was nitrided and fluorinated in the same manner as Example 1. The drawing speed of the dip method was adjusted, and a liquid lubricant that mainly contains perfluoropolyether was applied to the protective film to form a lubricating film having a film thickness of 0.8 nm and a lubricating film having a film thickness of 0.7 nm.

An AlTiC ball with a diameter of 2 mm was slid along each of these samples prepared in the manner described above, with a predetermined load and at a predetermined linear velocity, to measure how many times the AlTiC ball needed to be slid until the protective film would break. With these samples of the present example, it took a large count of 280 times and 260 times respectively to break the protective film. This result indicates that the samples of the present example have excellent durability.

Example 3

Using the same method as in Example 1, the film formation time was adjusted, and a DLC film with a film thickness of 2.0 nm and a DLC film with a film thickness of 1.8 nm were formed. The surface of each of these DLC films was nitrided and fluorinated in the same manner as Example 1. The fluorine was added in an amount of 10 at. %. The nitrogen was added in an amount of 10 at. %.

A liquid lubricant that mainly contains perfluoropolyether was applied to the protective film obtained in the manner described above by using the dip method, to form a lubricating film having a film thickness of 0.9 nm.

Nitric acid aqueous solution of a predetermined concentration was dropped on the sample that was prepared in the manner described above and then extracted, to measure the amount of Co elution by means of the ICP-MS. The amount of Co elution in the sample of the present example was as low as 0.017 $ng/cm^2$ and 0.025 $ng/cm^2$ respectively. This result indicates that the sample of the present example has excellent corrosion resistance.

Comparative Example 1

Using the same method as in Example 1, a sample was prepared on condition that the flow rate of the tetrafluoromethane gas was 0 sccm and the flow rate of the nitrogen gas 50 sccm. The film thickness of the DLC film was 2.2 nm. The film thickness of the lubricating film was 0.9 nm.

The film thickness of the DLC film was measured using the XRF. The composition and depth profile of the DLC film were measured using the XPS. The DLC film consisted mainly of carbon, hydrogen, and nitrogen present in a region approximately 0.4 nm deep from the surface of the DLC film, but did not contain fluorine. The nitrogen was added in an amount of 13 at. %.

An AlTiC ball with a diameter of 2 mm was slid along the sample prepared in the manner described above, with a predetermined load and at a predetermined linear velocity, to measure how many times the AlTiC ball needed to be slid until the protective film would break. With this sample of the present comparative example, it took a small count of 220 times to break the protective film. This result indicates that the sample of the present comparative example has poor durability.

Nitric acid aqueous solution of a predetermined concentration was dropped on the sample that was prepared in the manner described above and then extracted, to measure the amount of Co elution by means of the ICP-MS. The amount of Co elution in the sample of the present comparative example was as high as 0.034 $ng/cm^2$. This result indicates that the sample of the present comparative example has poor corrosion resistance.

Comparative Example 2

The drawing speed of the dip method was adjusted, and a liquid lubricant that mainly contains perfluoropolyether was applied to the protective film having a film thickness of 2.2 nm to form a lubricating film having a film thickness of 0.8 nm and a lubricating having a film thickness of 0.7 nm, the protective film being formed in the same manner as Comparative Example 1.

An AlTiC ball with a diameter of 2 mm was slid along each of these samples prepared in the manner described above, with a predetermined load and at a predetermined linear velocity, to measure how many times the AlTiC ball needed to be slid until the protective film would break. With these samples of the present comparative example, it took a small count of 190 times and 170 times respectively to break the protective film. This result indicates that the samples of the present comparative example have poor durability.

Comparative Example 3

Using the same method as in Comparative Example 1, the film formation time was adjusted, and a DLC film with a film thickness of 2.0 nm and a DLC film with a film thickness of 1.8 nm were formed. The nitrogen was added in an amount of 13 at. %.

A liquid lubricant that mainly contains perfluoropolyether was applied to the protective film obtained in the manner described above by using the dip method, to form a lubricating film having a film thickness of 0.9 nm.

Nitric acid aqueous solution of a predetermined concentration was dropped on the sample that was prepared in the manner described above and then extracted, to measure the amount of Co elution by means of the ICP-MS. The amount of Co elution in the sample of the present comparative example was as high as 0.040 ng/cm$^2$ and 0.055 ng/cm$^2$, respectively. This result indicates that the sample of the present comparative example has poor corrosion resistance.

Comparative Example 4

A sample was prepared by repeating the procedure of Comparative Example 1, except that the film thickness of the lubricating film was set at 1.2 nm. The film thickness of the protective film was 2.2 nm.

With this sample of the present comparative example, the AlTiC was slid 360 times until the protective film broke. This result indicates that the sample of the present comparative example has excellent durability. However, due to the increase in spacing loss with respect to the magnetic head, the electromagnetic conversion characteristics had worsened.

Comparative Example 5

A sample was prepared by repeating the procedure of Comparative Example 1, except that the film thickness of the DLC film was set at 2.5 nm. The film thickness of the lubricating film was 0.9 nm. The nitrogen was added in an amount of 13 at. %.

The amount of Co elution in the sample of the present comparative example was 0.028 ng/cm$^2$. This result indicates that the sample of the present comparative example has excellent corrosion resistance. However, due to the increase in spacing loss with respect to the magnetic head, the electromagnetic conversion characteristics had worsened.

Comparative Example 6

Using the same method as in Example 1, a sample in which the surface of its DLC film is fluorinated was prepared on condition that the flow rate of the nitrogen gas was 0 sccm, the flow rate of the tetrafluoromethane gas 40 sccm, and the processing time period 1.0 s. The film thickness of the DLC film was 2.2 nm. The film thickness of the lubricating film was 0.9 nm. The fluorine was added in an amount of 13 at. %.

An AlTiC ball with a diameter of 2 mm was slid along the sample prepared in the manner described above, with a predetermined load and at a predetermined linear velocity, to measure how many times the AlTiC ball needed to be slid until the protective film would break. With this sample of the present comparative example, it took a small count of 240 times to break the protective film. This result indicates that the sample of the present comparative example has poor durability. This is considered because the lubricating film falls off easily due to the absence of nitrogen in the surface of the DLC film.

Reference Example 1

A sample was prepared by repeating the procedure of Example 1, except that the film thickness of the lubricating film was set at 1.2 nm. The film thickness of the protective film was 2.2 nm.

With this sample of the present reference example, the AlTiC was slid 530 times until the protective film broke. This result indicates that the sample of the present reference example has excellent durability. However, due to the increase in spacing loss with respect to the magnetic head, the electromagnetic conversion characteristics had worsened.

Reference Example 2

A sample was prepared by repeating the procedure of Example 1, except that the film thickness of the DLC film was 2.5 nm. The film thickness of the lubricating film was 0.9 nm. The fluorine was added in an amount of 10 at. %. The nitrogen was added in an amount of 10 at. %.

The amount of Co elution of the sample of the present reference example was 0.008 ng/cm$^2$. This result indicates that the sample of the present reference example has excellent corrosion resistance. However, due to the increase in spacing loss with respect to the magnetic head, the electromagnetic conversion characteristics had worsened.

Table 1 shows the numbers of times the AlTiC ball was slid, which were obtained in Examples 1 and 2, Comparative Examples 1, 2, 4 and 6, and Reference Example 1, as well as evaluations thereof. Table 2 shows the amounts of Co elution that were obtained in Examples 1 and 3, Comparative Examples 1, 3 and 5, and Reference Example 2, as well as evaluations thereof.

TABLE 1

| | Thickness of Protective Film (nm) | Thickness of Lubricating Film (nm) | Fluorine/Nitrogen | Number of times AlTiC ball was slid (times) | Evaluations (Other) |
|---|---|---|---|---|---|
| Example 1 | 2.2 | 0.9 | Present/Present | 320 | Excellent |
| Example 2 | 2.2 | 0.8 | Present/Present | 280 | Excellent |
| Comparative Example 1 | 2.2 | 0.9 | Absent/Present | 220 | Poor |

TABLE 1-continued

| | Thickness of Protective Film (nm) | Thickness of Lubricating Film (nm) | Fluorine/Nitrogen | Number of times AlTiC ball was slid (times) | Evaluations (Other) |
|---|---|---|---|---|---|
| Comparative | 2.2 | 0.8 | Absent/Present | 190 | Poor |
| Comparative Example 4 | 2.2 | 1.2 | Absent/Present | 360 | Poor (electromagnetic conversion characteristics worsened) |
| Comparative | 2.2 | 0.9 | Present/Absent | 240 | Poor |
| Reference Example 1 | 2.2 | 1.2 | Present/Present | 530 | Poor (electromagnetic conversion characteristics worsened) |

TABLE 2

| | Thickness of Protective Film (nm) | Thickness of Lubricating Film (nm) | Fluorine/Nitrogen | Amount of Co Elution (ng/cm$^2$) | Evaluations (Other) |
|---|---|---|---|---|---|
| Example 1 | 2.2 | 0.9 | Present/Present | 0.012 | Excellent |
| Example 3 | 2.0 | 0.9 | Present/Present | 0.017 | Excellent |
| | 1.8 | 0.9 | Present/Present | 0.025 | Excellent |
| Comparative Example 1 | 2.2 | 0.9 | Absent/Present | 0.034 | Poor |
| Comparative | 2.0 | 0.9 | Absent/Present | 0.040 | Poor |
| Example 3 | 1.8 | 0.9 | Absent/Present | 0.055 | Poor |
| Comparative Example 5 | 2.5 | 0.9 | Absent/Present | 0.028 | Poor (electromagnetic conversion characteristics worsened) |
| Reference Example 2 | 2.5 | 0.9 | Present/Present | 0.008 | Poor (electromagnetic conversion characteristics worsened) |

The invention claimed is:

1. A magnetic recording medium, comprising:
a substrate;
a metal film layer disposed on the substrate;
a protective film disposed on the metal film layer; and
a lubricant film disposed on a surface of the protective film,
wherein the protective film is comprised of amorphous carbon containing fluorine and nitrogen in a surface region, and
wherein a region of the protective film deeper than 0.5 nm deep from said surface of the protective film is substantially free from the fluorine and nitrogen.

2. The magnetic recording medium protective film according to claim 1, wherein the protective film has a film thickness of equal to or greater than 1.7 nm but equal to or less than 2.3 nm.

3. The magnetic recording medium according to claim 1, wherein the fluorine and nitrogen are each added in an amount of 5 to 20 at. %.

4. The magnetic recording medium according to claim 1, wherein the lubricating film has a film thickness of equal to or greater than 0.6 nm but equal to or less than 1.0 nm.

5. A magnetic recording medium, comprising:
a substrate;
a metal film layer disposed on the substrate;
a protective film disposed on the metal film and being comprised of amorphous carbon containing fluorine and nitrogen, the fluorine and the nitrogen each being added in an amount of 5 to 20 at. % and being present in a surface region of the protective film, by plasma processing the amorphous carbon in a fluorine containing gas and a nitrogen containing gas; and
a lubricant film disposed on a surface of the protective film,
wherein a region of the protective film deeper than 0.5 nm deep from said surface of the protective film is substantially free from the fluorine and nitrogen.

6. The magnetic recording medium according to claim 5, wherein the protective film has a film thickness of equal to or greater than 1.7 nm but equal to or less than 2.3 nm.

7. The magnetic recording medium according to claim 5, wherein the lubricating film has a film thickness of equal to or greater than 0.6 nm but equal to or less than 1.0 nm.

* * * * *